United States Patent
Lim et al.

(10) Patent No.: US 10,679,940 B2
(45) Date of Patent: Jun. 9, 2020

(54) MASK AND METAL WIRING OF A SEMICONDUCTOR DEVICE FORMED USING THE SAME

(71) Applicant: Samsung Electronics Co., Ltd., Suwon-si, Gyeonggi-do (KR)

(72) Inventors: Jong-Seok Lim, Hwaseong-si (KR); Hyeun-Su Kim, Suwon-si (KR); Jung-Hoon Sung, Seoul (KR); Kweon-Jae Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 344 days.

(21) Appl. No.: 15/285,631

(22) Filed: Oct. 5, 2016

(65) Prior Publication Data
US 2017/0098601 A1  Apr. 6, 2017

(30) Foreign Application Priority Data

Oct. 5, 2015 (KR) .......................... 10-2015-0139596

(51) Int. Cl.
| | |
|---|---|
| *H01L 23/528* | (2006.01) |
| *G03F 1/38* | (2012.01) |
| *G03F 1/60* | (2012.01) |
| *H01L 21/033* | (2006.01) |
| *H01L 21/768* | (2006.01) |
| *H01L 23/522* | (2006.01) |

(52) U.S. Cl.
CPC .............. *H01L 23/528* (2013.01); *G03F 1/38* (2013.01); *G03F 1/60* (2013.01); *H01L 21/0335* (2013.01); *H01L 21/0337* (2013.01); *H01L 21/0338* (2013.01); *H01L 21/76816* (2013.01); *H01L 21/76877* (2013.01); *H01L 23/5226* (2013.01)

(58) Field of Classification Search
None
See application file for complete search history.

(56) References Cited

U.S. PATENT DOCUMENTS

| 5,534,728 A | 7/1996 | Kim et al. |
| 7,665,055 B2 | 2/2010 | Kobayashi |
| 7,898,007 B2 | 3/2011 | Lee et al. |

(Continued)

FOREIGN PATENT DOCUMENTS

| JP | 2012-028479 A | 2/2012 |
| KR | 10-2004-0086861 A | 10/2004 |
| KR | 10-2006-0124315 A | 12/2006 |

(Continued)

*Primary Examiner* — Telly D Green
(74) *Attorney, Agent, or Firm* — Harness, Dickey & Pierce, P.L.C.

(57) ABSTRACT

A mask including a mask substrate including a cell exposure region and a peripheral exposure region, the cell exposure region configured to expose a metal layer in a cell region of a semiconductor device, the peripheral exposure region configured to expose a metal layer in a peripheral region of the semiconductor device, a first mask pattern configured to expose the metal layer in the peripheral exposure region of the mask substrate to form a signal metal pattern, and a second mask pattern configured to expose the metal layer in the peripheral exposure region of the mask substrate to form a dummy metal pattern, the second mask pattern being adjacent to the first mask pattern, and the second mask pattern having a substantially same width as a width of the first mask pattern may be provided.

15 Claims, 9 Drawing Sheets

(56) References Cited

U.S. PATENT DOCUMENTS 8,736,063 B2    5/2014    Takada et al.

FOREIGN PATENT DOCUMENTS

| KR | 10-2009-0067707 A | 6/2009 |
| KR | 10-2009-0121472 A | 11/2009 |
| KR | 10-0949873 B | 3/2010 |
| KR | 10-2010-0127678 A | 12/2010 |

MASK AND METAL WIRING OF A SEMICONDUCTOR DEVICE FORMED USING THE SAME

CROSS-RELATED APPLICATION

This application claims priority under 35 USC § 119 to Korean Patent Application No. 10-2015-0139596, filed on Oct. 5, 2015 in the Korean Intellectual Property Office (KIPO), the contents of which are herein incorporated by reference in its entirety.

BACKGROUND

1. Field

Example embodiments relate to masks and/or metal wirings of a semiconductor device formed using the same. More particularly, example embodiments relate to masks used for forming a metal wiring in a peripheral region of a semiconductor device, and/or metal wirings of a semiconductor device formed using the mask.

2. Description of the Related Art

Generally, a metal wiring of a semiconductor device may be formed by an exposure process using a mask. The metal wiring may be arranged in a cell region and a peripheral region of the semiconductor device. A pitch between the metal wirings in the peripheral region may be wider than a pitch between the metal wirings in the cell region. Further, the metal wirings in the cell region may have a uniform interval. In contrast, the metal wirings in the peripheral region may have various different intervals. As a pitch between the metal wirings of the semiconductor device narrows, exposure processes using an off-axis illumination have been being used to form metal wirings having the narrow pitch.

According to related arts, the off-axis illumination may have a focus corresponding to the pitch between the metal wirings in the cell region. In contrast, the focus of the off-axis illumination may not correspond to the pitch (or pitches) between the metal wirings in the peripheral region. Therefore, the metal wirings in the peripheral region formed using the off-axis illumination may not have a desired shape or pattern. For example, the metal wiring in the peripheral region may have a size larger than a designed size, thereby being connected to the adjacent metal wirings. In contrast, the metal wiring in the peripheral region may have a size smaller than the designed size, thereby causing the metal wiring to be cut.

SUMMARY

Some example embodiments provide masks that are capable of accurately forming a metal wiring in a peripheral region having a designed size.

Some Example embodiments also provide metal wirings of a semiconductor device using the above-mentioned mask.

According to an example embodiment, a mask includes a mask substrate including a cell exposure region and a peripheral exposure region, the cell exposure region configured to expose a metal layer in a cell region of a semiconductor device, the peripheral exposure region configured to expose a metal layer in a peripheral region of the semiconductor device, a first mask pattern configured to expose the metal layer in the peripheral exposure region of the mask substrate to form a signal metal pattern, and a second mask pattern configured to expose the metal layer in the peripheral exposure region of the mask substrate to form a dummy metal pattern, the second mask pattern being adjacent to the first mask pattern, and the second mask pattern having a substantially same width as a width of the first mask pattern.

In some example embodiments, the second mask pattern may have a center line coinciding with a center line of the first mask pattern along a straight line.

In some example embodiments, the mask may include a plurality of first mask patterns arranged on a straight line, the first mask patterns including the first mask pattern, the second mask pattern may be between the first mask patterns along the straight line, and a distance between the second mask pattern and one of the first mask patterns may be substantially same as a distance between the second mask pattern and another of the first mask patterns.

In some example embodiments, center lines of the first mask patterns and a center line of the second mask pattern may coincide with each other along the straight line.

In some example embodiments, the mask may include a plurality of first mask patterns being parallel to each other, the first mask patterns including the first mask pattern, the second mask pattern may be parallel to the first mask patterns and is between the first mask patterns, an a distance between the second mask pattern and one of the first mask patterns may be substantially same as a distance between the second mask pattern and another of the first mask patterns.

In some example embodiments, the distance between the second mask pattern and the one of the first mask patterns may be substantially same as a distance between adjacent mask patterns in the cell exposure region.

In some example embodiments, the first mask patterns may have different widths, and the second mask pattern may have a width substantially same as the shortest width among the widths of the first mask patterns.

In some example embodiments, the mask may include a plurality of second mask patterns, each of the second mask patterns may be between respective ones of the first mask patterns, the second mask patterns may be parallel to each other, the second mask patterns may include the second mask pattern, and a distance between the second mask patterns may be substantially same as the distance between the second mask pattern and the first mask pattern.

According to an example embodiment, a metal wiring of a semiconductor device includes a signal metal pattern in a peripheral region of a semiconductor substrate, and a dummy metal pattern in the peripheral region, the dummy metal pattern being adjacent to the signal metal pattern, and the dummy metal pattern having a width substantially same as a width of the signal metal pattern.

In some example embodiments, the dummy metal pattern may have a center line coinciding with a center line of the signal metal pattern along a straight line.

In some example embodiments, the metal wiring may include a plurality of signal metal patterns arranged on a straight line, the signal metal patterns may include the signal metal pattern, the dummy metal pattern may be between the signal metal patterns along the straight line, and a distance between the dummy metal pattern and one of the signal metal patterns may be substantially same as a distance between the dummy metal pattern and another of the signal metal patterns.

In some example embodiments, a center line of the signal metal patterns and a center line of the dummy metal pattern may coincide with each other along the straight line.

In some example embodiments, the metal wiring may include a plurality of signal metal patterns being parallel to each other, the signal metal patterns including the signal metal pattern, the dummy metal pattern may be parallel to the signal metal patterns and is between the signal metal patterns, and a distance between the dummy metal pattern and one of the signal metal patterns is substantially same as a distance between the dummy metal pattern and another of the signal metal patterns.

In some example embodiments, the signal metal patterns may have different widths, and the dummy metal pattern may have a width substantially same as the shortest width among the widths of the signal metal patterns.

In some example embodiments, the metal wiring may include a plurality of dummy metal patterns arranged between the signal metal patterns, the dummy metal patterns may include the dummy metal pattern, and a distance between the dummy metal patterns may be substantially same as the distance between the dummy metal pattern and the signal metal pattern.

According to an example embodiment, a metal wiring of a semiconductor device includes at least one signal metal pattern in a peripheral region of a semiconductor substrate, the at least one signal metal pattern electrically connected to a circuit of the semiconductor substrate, and at least one dummy metal pattern in the peripheral region and filling regions unoccupied by the at least one signal metal pattern, the at least one dummy metal pattern electrically insulated from the circuit of the semiconductor substrate, the at least one dummy metal pattern having a width substantially same as a width of the at least one signal metal pattern, a distance between neighboring two from among the at least one dummy metal pattern and the at least one signal metal pattern being substantially same as a distance between cell metal patterns in a cell region.

In some example embodiments, the at least one signal metal pattern may be parallel to the at least one dummy metal pattern.

In some example embodiments, the at least one signal metal pattern may include a first signal metal pattern, and a second signal metal pattern and the at least one dummy metal pattern may be between the first and second signal metal patterns such that center lines of the first and second metal lines and a center line of the at least one dummy metal pattern form a straight line.

In some example embodiments, a first distance between the first signal metal pattern and the at least one dummy metal pattern may be substantially same as a second distance between the second signal metal pattern and the at least one dummy metal pattern.

In some example embodiments, the at least one signal metal pattern may include a plurality of signal metal patterns having different widths, and the at least one dummy metal pattern may have a width substantially same as a shortest width from among the signal metal patterns.

According to an example embodiment, the second mask pattern for forming the dummy metal pattern in the peripheral region of the semiconductor substrate may be arranged between the first mask patterns for forming the signal metal pattern in the peripheral region of the semiconductor substrate. The width of the second mask pattern may be substantially the same as the width of the first mask pattern. Thus, the metal wiring in the peripheral region formed using the mask may have a minute and uniform pitch corresponding to a pitch of the metal wiring in the cell region. As a result, the metal wiring in the peripheral region using the mask and an off-axis illumination may have a designed shape and size so that a short between the metal wirings and/or a cut of the metal wiring in the peripheral region may be inhibited or prevented.

BRIEF DESCRIPTION OF THE DRAWINGS

Example embodiments will be more clearly understood from the following detailed description taken in conjunction with the accompanying drawings.

FIG. 1 is a plan view illustrating a mask in accordance with an example embodiment;

FIG. 2 is an enlarged plan view of a portion "II" in FIG. 1;

FIG. 3 is an enlarged plan view of a portion "III" in FIG. 1;

FIG. 4 is an enlarged plan view of a portion "IV" in FIG. 1;

FIG. 5 is an enlarged plan view of a portion "V" in FIG. 1;

FIG. 6 is an enlarged plan view of a portion "VI" in FIG. 1;

FIGS. 7 to 9 are cross-sectional views illustrating a method of forming a metal wiring of a semiconductor device using the mask in FIG. 1, according to an example embodiment;

FIG. 10 is a plan view illustrating a metal wiring of the semiconductor device using the mask in FIG. 1;

FIG. 11 is an enlarged plan view of a portion "XI" in FIG. 10;

FIG. 12 is an enlarged plan view of a portion "XII" in FIG. 10;

FIG. 13 is an enlarged plan view of a portion "XIII" in FIG. 10;

FIG. 14 is an enlarged plan view of a portion "XIV" in FIG. 10; and

FIG. 15 is an enlarged plan view of a portion "XV" in FIG. 10.

DETAILED DESCRIPTION OF THE EMBODIMENTS

Figure 1:
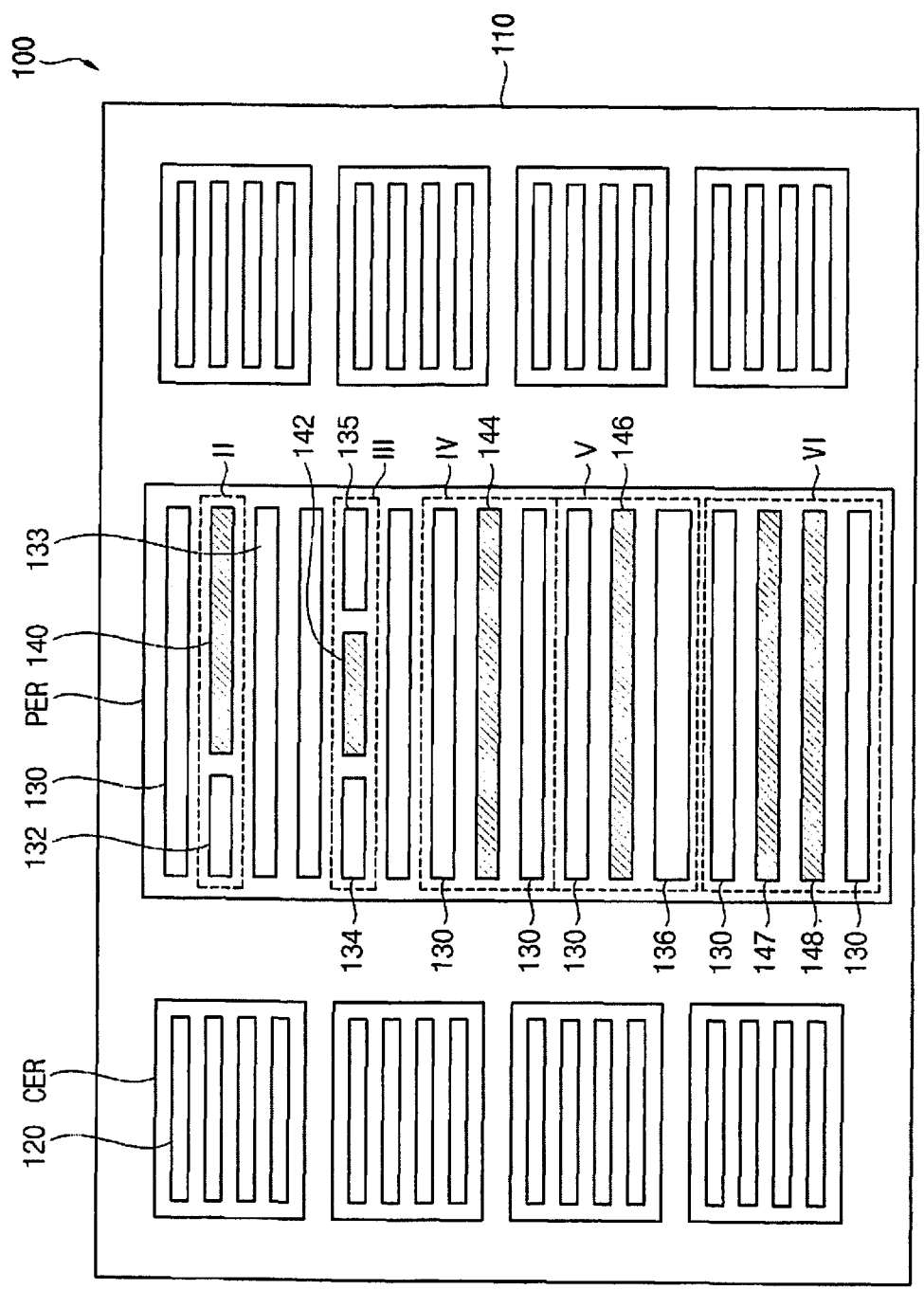
FIGS. 1 to 15 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Mask

Figure 2:
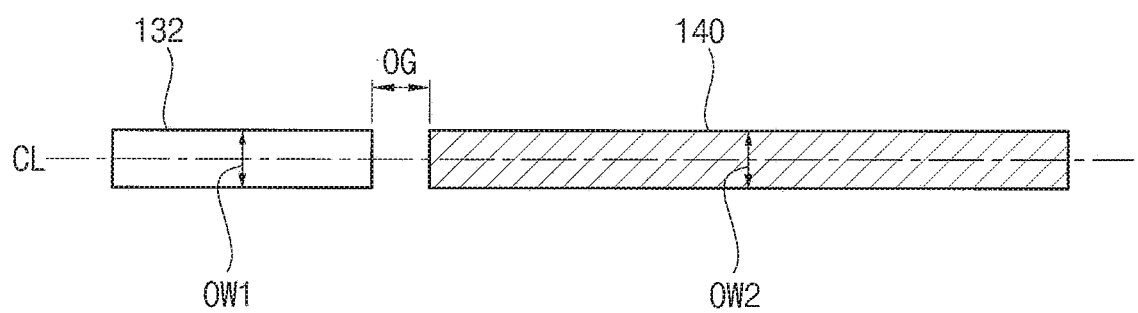
Figure 3:
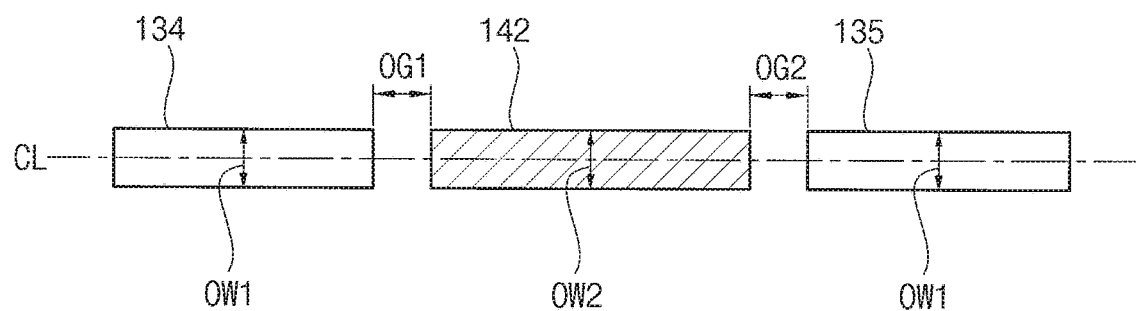
Figure 4:
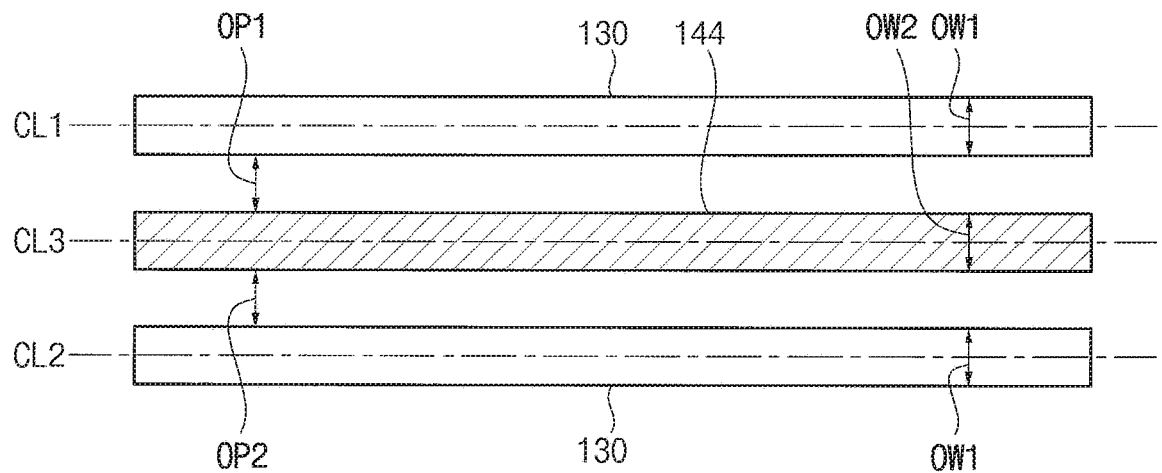
Figure 5:
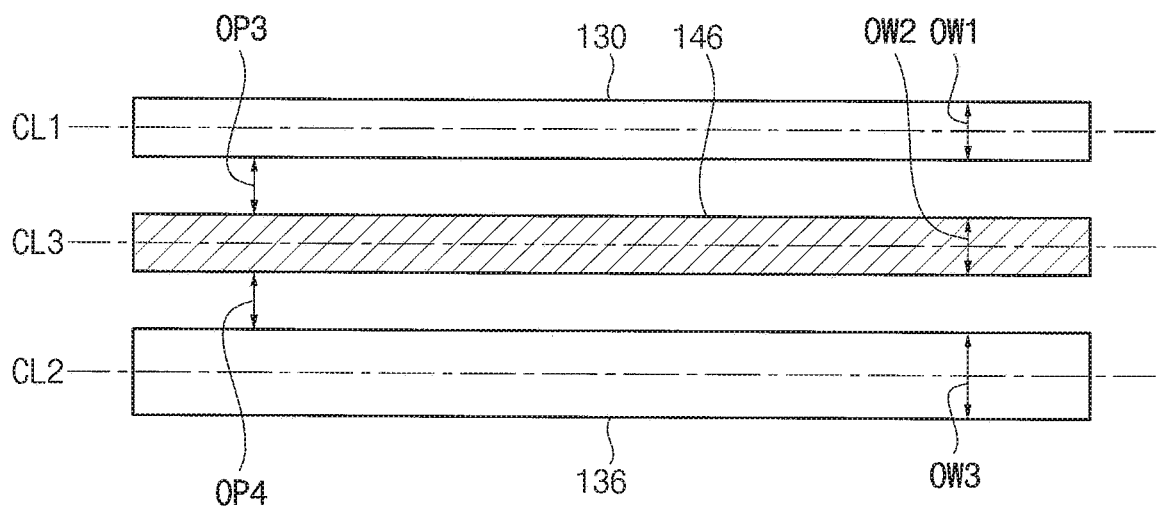
Figure 6:
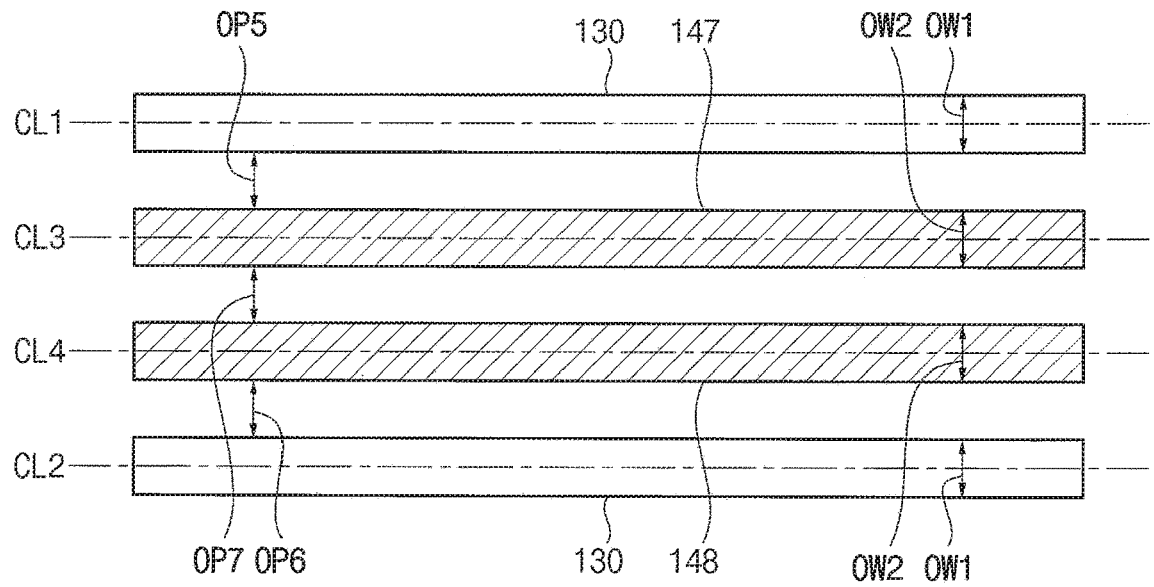

FIG. 1 is a plan view illustrating a mask in accordance with an example embodiment, FIG. 2 is an enlarged plan view of a portion "II" in FIG. 1, FIG. 3 is an enlarged plan view of a portion "III" in FIG. 1, FIG. 4 is an enlarged plan view of a portion "IV" in FIG. 1, FIG. 5 is an enlarged plan view of a portion "V" in FIG. 1, and FIG. 6 is an enlarged plan view of a portion "VI" in FIG. 1.

Referring to FIG. 1, a mask 100 of this example embodiment includes a mask substrate 110, cell mask patterns 120, first mask patterns 130, 132, 133, 134, 135, 136, and 138 (e.g., a first first-mask-pattern 130, a second first-mask-pattern 132, a third first-mask-pattern 133, a fourth first-mask-pattern 134, a fifth first-mask-pattern 135, and a sixth first-mask-pattern 136) and second mask patterns 140, 142, 144, 146, 147, and 148 (e.g., a first second-mask-pattern 140, a second second-mask-pattern 142, a third second-mask-pattern 144, a fourth second-mask-pattern 146, a fifth second-mask-pattern 147, and a sixth second-mask-pattern 148).

The mask substrate 110 may have a cell exposure region CER and a peripheral exposure region PER. The cell mask patterns 120 may be formed in the cell exposure region CER. The cell mask patterns 120 in the cell exposure region CER may function as to expose a metal layer in a cell region of a semiconductor device to form main metal patterns. The first mask patterns 130, 132, 133, 134, 135, and 136 and the second mask patterns 140, 142, 144, 146, 147, and 148 may be formed in the peripheral exposure region PER. The first mask patterns 130, 132, 133, 134, 135, and 136 in the peripheral exposure region PER may function as to expose a metal layer in a peripheral region of the semiconductor device to form signal metal patterns. The second mask patterns 140, 142, 144, 146, 147, and 148 in the peripheral exposure region PER may function as to expose the metal layer in the peripheral region to form dummy metal patterns.

The cell mask patterns 120 may include openings through which light may pass. The cell mask patterns 120 may have an elongated bar shape. The cell mask patterns 120 may be arranged spaced apart from each other by substantially the same interval. Thus, pitches between the cell mask patterns 120 may be substantially same to each other.

The first mask patterns 130, 132, 133, 134, 135, and, 136 may include openings through which the light may pass. The first mask patterns 130, 132, 133, 134, 135, and 136 may have an elongated bar shape. The first mask patterns 130, 132, 133, 134, 135, and 136, may have a first width OW1 or a third width OW3. The first width OW1 of the first mask patterns 130, 132, 133, 134, 135, and 136 may be substantially the same as a width of the cell mask patterns 120. According to some example embodiments, the first width OW1 of the first mask patterns 130, 132, 133, 134, 135, and 136 may be different from the width of the cell mask patterns 120.

As mentioned above, the pitch between the cell mask patterns 120 in the cell exposure region CER may be uniform. In contrast, pitches between the first mask patterns 130, 132, 133, 134, 135, and 136 in the peripheral exposure region PER may not be uniform. That is, the pitches between the first mask patterns 130, 132, 133, 134, 135, and 136 in the peripheral exposure region PER may be different from each other. Further, the first mask patterns 130, 132, 133, 134, 135, and 136 may have different lengths. As a result, portions in which the first mask patterns 130, 132, 133, 134, 135, and 136 are not arranged may exist in the peripheral exposure region PER of the mask substrate 110.

Here, the light incident to the mask 100 from an off-axis illumination may be configured to form a focus corresponding to a minute pitch between the main metal patterns to be formed in the cell region of the semiconductor device using the cell mask patterns 120. However, the focus of the light may not correspond to a pitch between the signal metal patterns to be formed in the peripheral region of the semiconductor device using the first mask patterns 130, 132, 133, 134, 135, and 136. Therefore, the signal metal patterns in the peripheral region may not be formed to have a designed shape or a desired pattern.

The second mask patterns 140 may be formed in the portions of the peripheral exposure region PER of the mask substrate 110 in which the first mask patterns 130 are not be arranged. The second mask patterns 140 may enable the focus of the light emitted from the off-axis illumination to correspond to the pitch between the signal metal patterns.

The second mask patterns 140, 142, 144, 146, 147, and 148 may include openings through which the light may pass. The second mask patterns 140, 142, 144, 146, 147, and 148 may be positioned adjacent to the first mask patterns 130, 132, 133, 134, 135, and 136. The second mask pattern 140 may have a second width OW2 substantially the same as the first width OW1 of the first mask pattern 130. Thus, the signal metal pattern formed by the first mask pattern 130 may have a width substantially the same as a width of the dummy metal pattern formed by the second mask pattern 140. The dummy metal pattern between the signal metal patterns may provide the metal wiring in the peripheral region of the semiconductor device with a pitch substantially the same as the pitch between the main metal patterns in the cell region of the semiconductor device.

Referring to FIG. 2, the second mask pattern 140 may be positioned adjacent to a first mask pattern 132 having a relatively short length. The first mask pattern 132 and the second mask pattern 140 may be positioned on a straight line. Because the first width OW1 of the first mask pattern 132 may be substantially the same as the second width OW2 of the second mask pattern 140, the first mask pattern 132 and the second mask pattern 140 may have a same center line CL along the straight line. The second mask pattern 140 may be spaced apart from the first mask pattern 132 by a gap OG. The gap OG may be a distance between adjacent side surfaces of the first mask pattern 132 and the second mask pattern 140.

Referring to FIG. 3, a second mask pattern 142 having a relatively short length may be arranged between two first mask patterns 134 and 135, each having a relatively short length, positioned on a straight line. The second mask pattern 142 may be positioned on the straight line. Thus, the first mask patterns 134 and 135 and the second mask pattern 142 may have a common center line CL along the straight line.

Further, a gap between the second mask pattern 142 and the first mask pattern 134 may be substantially the same as a gap between the second mask pattern 142 and the first mask pattern 135. For example, a first gap OG1 between adjacent side surfaces of the second mask pattern 142 and the first mask pattern 134 may be substantially the same as a second gap OG2 between adjacent side surfaces of the second mask pattern 142 and the first mask pattern 135. The first gap OG1 and the second gap OG2 may be substantially the same as the gap OG between the first mask pattern 132 and the second mask pattern 140 in FIG. 2. The gap OG, the first gap OG1 and the second gap OG2 may be determined in accordance with a design rule of the metal wiring in the semiconductor device.

Referring to FIG. 4, the two first mask patterns 130 in the peripheral exposure region PER may be parallel to each other. The first mask patterns 130 may have the first width OW1. In FIG. 4, the upper first mask pattern 130 may have a first center line CL1. The lower first mask pattern 130 may have a second center line CL2. A pitch between the first mask patterns 130 in the peripheral exposure region PER may be wider than the pitch between the cell mask patterns 120 in the cell exposure region CER.

A second mask pattern 144 may be arranged between the first mask patterns 130. The second mask pattern 144 may have a length substantially the same as the length of the first mask patterns 130. The second mask pattern 144 may have the second width OW2 substantially the same as the first width OW1 of the first mask patterns 130. The second mask pattern 144 may be substantially parallel to the first mask patterns 130. Thus, the second mask pattern 144 may have a third center line CL3 substantially parallel to the first and second center lines CL1 and CL2 of the first mask patterns 130.

The first mask patterns 130 and the second mask pattern 144 may be arranged by substantially the same pitch. For example, a first pitch OP1 between the second mask pattern 144 and the upper first mask pattern 130 may be substantially the same as a second pitch OP2 between the second mask pattern 144 and the lower first mask pattern 130. That is, a distance between an upper surface of the second mask pattern 144 and a lower surface of the upper first mask pattern 130 may be substantially the same as a distance between a lower surface of the second mask pattern 144 and an upper surface of the lower first mask pattern 130.

Referring to FIG. 5, the first mask pattern 130 and a first mask pattern 136 in the peripheral exposure region PER may be parallel to each other. In FIG. 5, the upper first mask pattern 130 may have the first width OW1, and the lower first mask pattern 136 may have a third width OW3 wider than the first width OW1. The upper first mask pattern 130 may have a first center line CL1. The lower first mask pattern 136 may have a second center line CL2. A pitch between the first mask patterns 130 and 136 in the peripheral exposure region PER may be wider than the pitch between the cell mask patterns 120 in the cell exposure region CER.

A second mask pattern 146 may be arranged between the first mask patterns 130 and 136. The second mask pattern 146 may have a length substantially the same as that of the first mask patterns 130 and 136. The second mask pattern 146 may have the second width OW2 substantially the same as the first width OW1 of the first mask pattern 130. According to some example embodiments, the second width OW2 of the second mask pattern 146 may be substantially the same as the third width OW3 of the first mask pattern 136. The second mask pattern 146 may be parallel to the first mask patterns 130 and 136. Thus, the second mask pattern 146 may have a third center line CL3 substantially parallel to the first and second center lines CL1 and CL2 of the first mask patterns 130 and 136.

The first mask patterns 130 and 136 and the second mask pattern 146 may be arranged by substantially the same pitch. For example, a third pitch OP3 between the second mask pattern 146 and the upper first mask pattern 130 may be substantially the same as a fourth pitch OP4 between the second mask pattern 146 and the lower first mask pattern 136. That is, a distance between an upper surface of the second mask pattern 146 and a lower surface of the upper first mask pattern 130 may be substantially the same as a distance between a lower surface of the second mask pattern 146 and an upper surface of the lower first mask pattern 136.

Referring to FIG. 6, the two first mask patterns 130 in the peripheral exposure region PER may be parallel to each other. The first mask patterns 130 may have the first width OW1. In FIG. 6, the upper first mask pattern 130 may have the first center line CL1. The lower first mask pattern 130 may have the second center line CL2. A pitch between the first mask patterns 130 in the peripheral exposure region PER may be wider than the pitch between the cell mask patterns 120 in the cell exposure region CER. For example, the pitch between the first mask patterns 130 in FIG. 6 may be wider than the pitch between the first mask patterns 130 in FIG. 4.

Because the pitch between the first mask patterns 130 is relatively wide, for example, two second mask patterns 147 and 148 may be arranged between the first mask patterns 130. The second mask patterns 147 and 148 may have a length substantially the same as that of the first mask patterns 130. The second mask patterns 147 and 148 each may have the second width OW2 substantially the same as the first width OW1 of the first mask pattern 130. The second mask patterns 147 and 148 may be parallel to the first mask patterns 130. Thus, the second mask patterns 147 and 148 may have a third center line CL3 and a fourth center line CL4, respectively, substantially parallel to the first center line CL1 and the second center line CL2 of the first mask patterns 130.

The first mask patterns 130 and 136 and the second mask patterns 147 and 148 may be arranged by substantially the same pitch. For example, a fifth pitch OP5 between the upper second mask pattern 147 and the upper first mask pattern 130, a sixth pitch OP6 between the lower second mask pattern 148 and the lower first mask pattern 130, and a seventh pitch OP7 between the second mask patterns 147 and 148 may be substantially same to each other. That is, a distance between an upper surface of the upper second mask pattern 147 and a lower surface of the upper first mask pattern 130, a distance between a lower surface of the upper second mask pattern 147 and an upper surface of the lower second mask pattern 148, and a distance between a lower surface of the lower second mask pattern 148 and an upper surface of the lower first mask pattern 130 may be substantially same to each other.

In the present example embodiment, the two second mask patterns 147 and 148 are arranged between the first mask patterns 130. However, the number of the second mask patterns between the first mask patterns is not restricted to or within a specific number. The number of the second mask patterns between the first mask patterns may be determined in accordance with the pitch between the first mask patterns 130.

In order to focus the light emitted from the off-axis illumination on the semiconductor device regardless of areas (e.g., regardless of cell region or peripheral region, the pitch between the first mask pattern and the second mask pattern in the peripheral exposure region PER and the pitch between the second mask patterns may be configured to be substantially the same as the pitch between the cell mask patterns in the cell exposure region CER.

Figure 7:
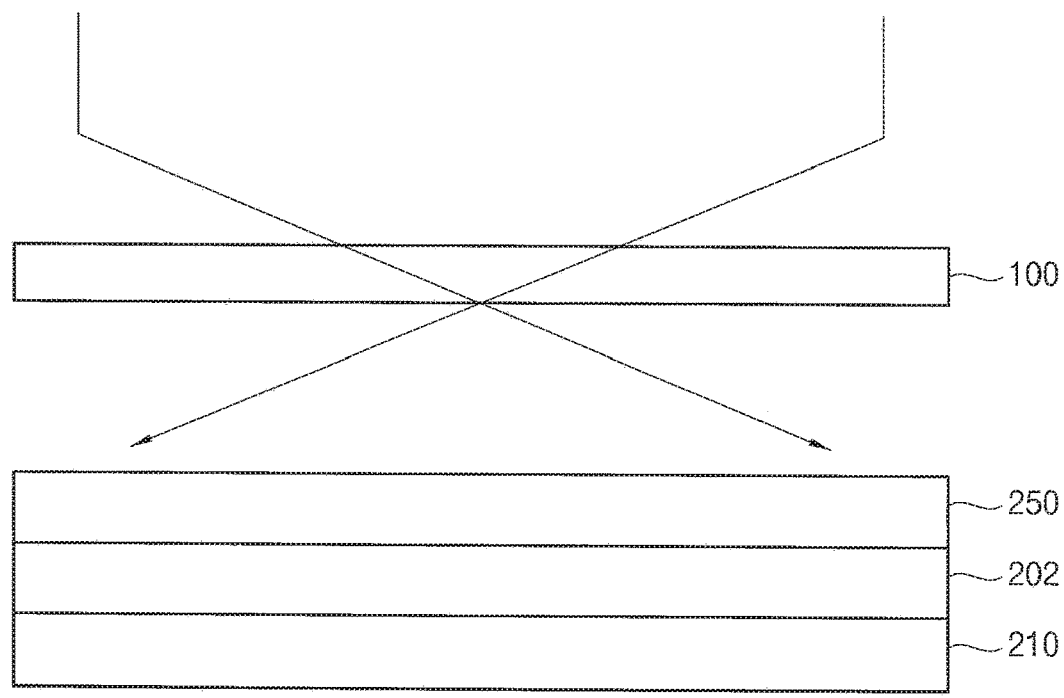
Figure 8:
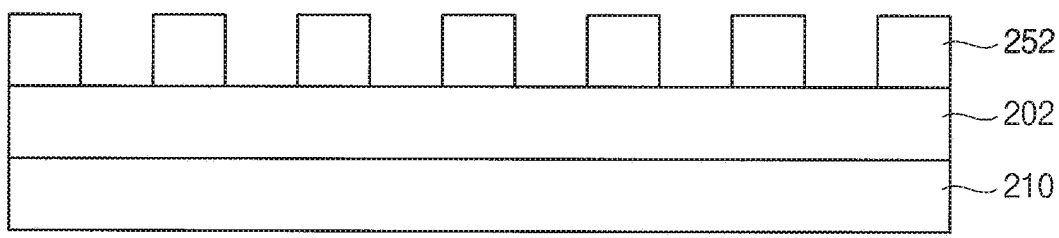
Figure 9:
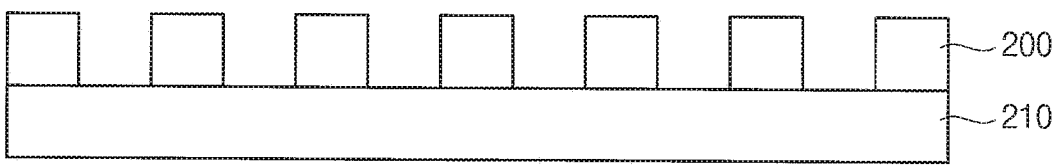

FIGS. 7 to 9 are cross-sectional views illustrating a method of forming a metal wiring of a semiconductor device using the mask in FIG. 1, according to an example embodiment.

Referring to FIG. 7, a metal layer 202 may be formed on an upper surface of a semiconductor substrate 210. A photoresist film 250 may be formed on an upper surface of the metal layer 202. The mask 100 in FIG. 1 may be arranged over the photoresist film 250.

A light emitted from an off-axis illumination may be slantly incident to the mask 100. The light incident to the cell exposure region CER may be irradiated to the photoresist film 250 through the cell mask patterns 120. The light incident to the peripheral exposure region PER may be irradiated to the photoresist film 250 through the first mask patterns 130 and the second mask patterns 140.

Referring to FIG. 8, a developing process may be performed on the exposed photoresist film 250 to form a photoresist pattern 252.

Referring to FIG. 9, the metal layer 202 may be etched using the photoresist pattern 252 as an etch mask to form a metal wiring 200.

Metal Wiring of a Semiconductor Device

Figure 10:
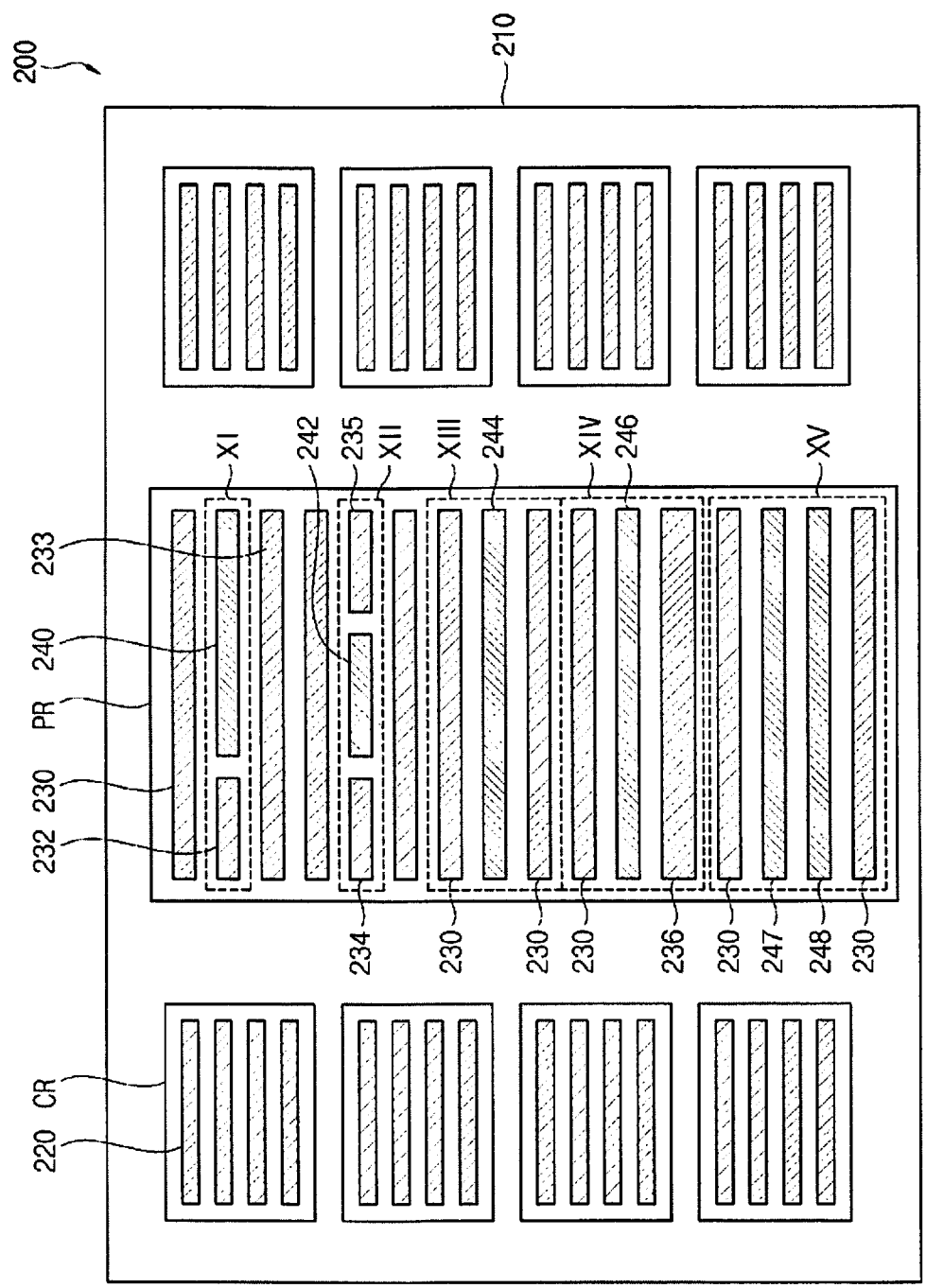
Figure 11:
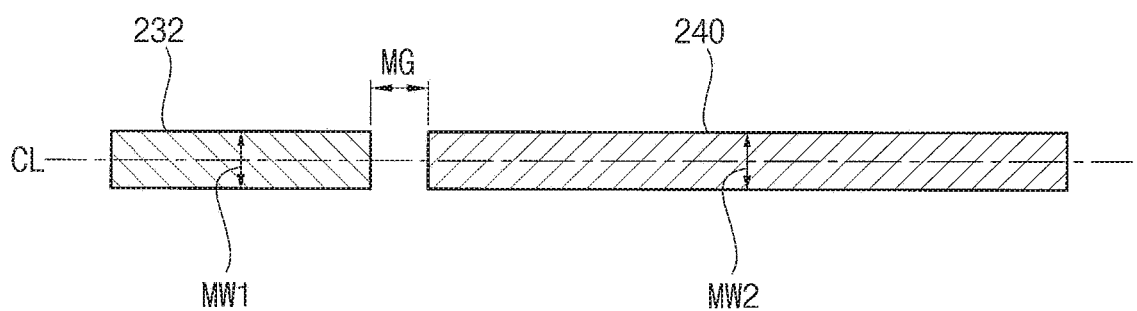
Figure 12:
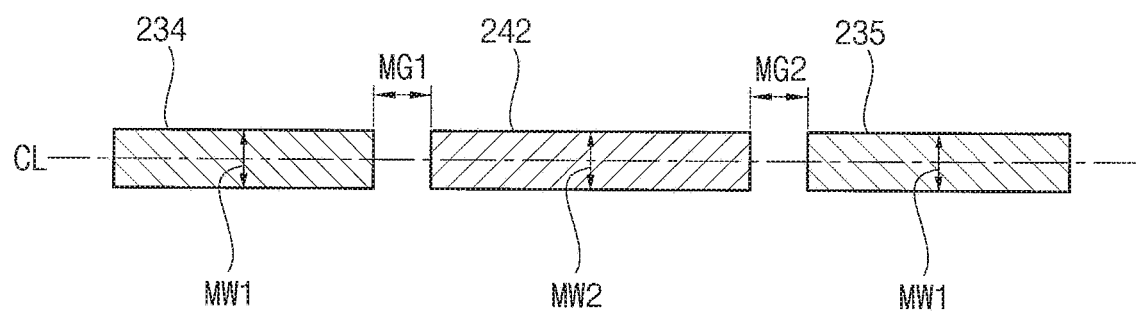
Figure 13:
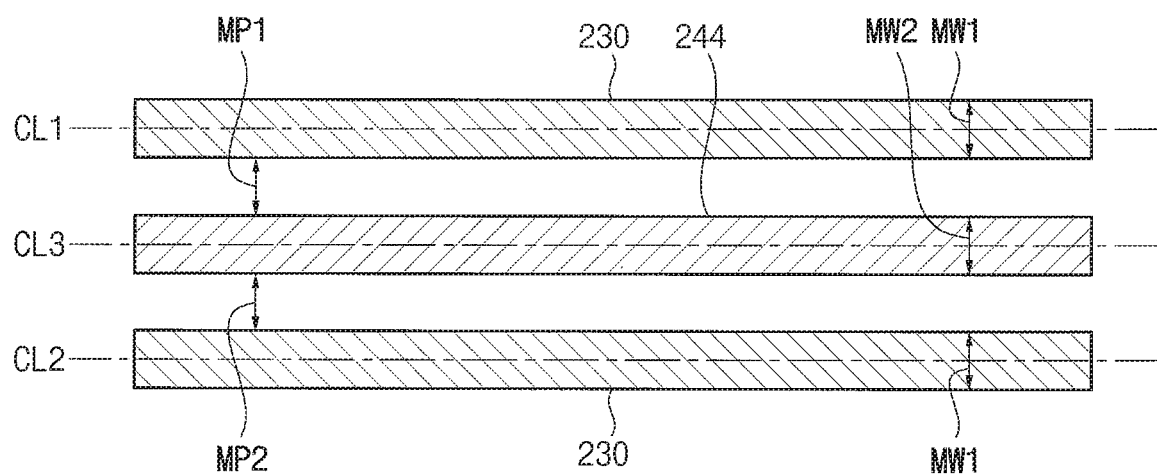
Figure 14:
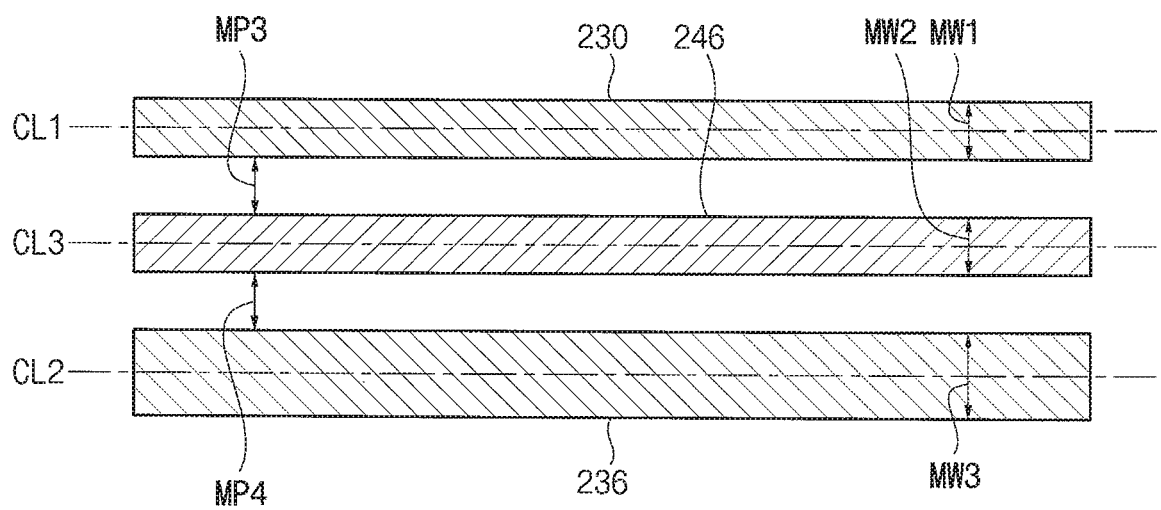
Figure 15:
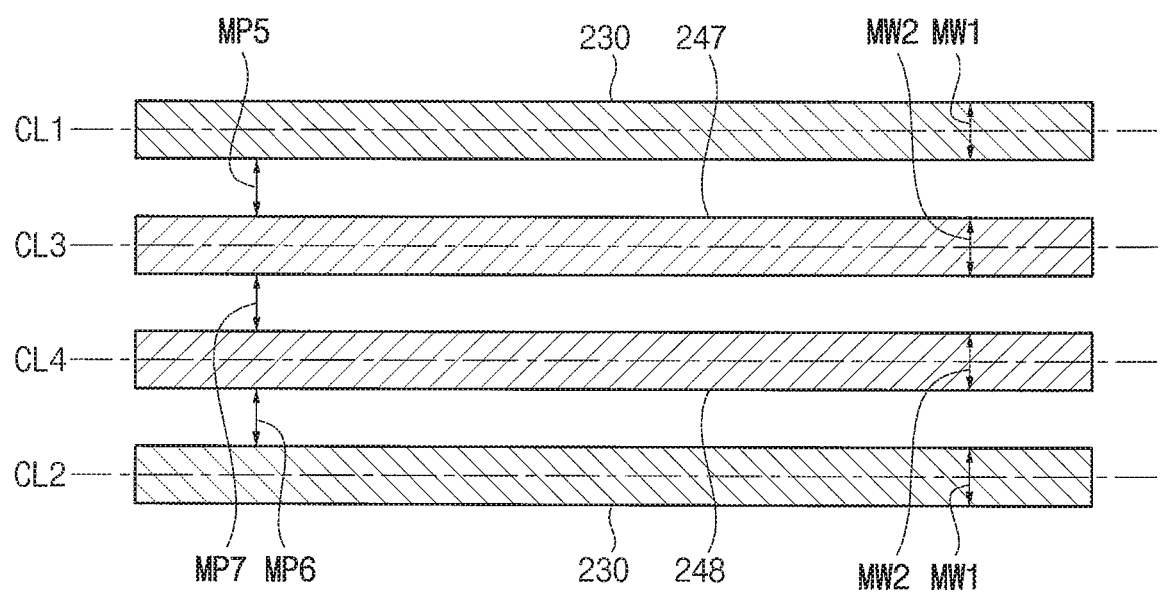

FIG. 10 is a plan view illustrating a metal wiring of the semiconductor device using the mask in FIG. 1, FIG. 11 is an enlarged plan view of a portion "XI" in FIG. 10, FIG. 12 is an enlarged plan view of a portion "XII" in FIG. 10, FIG. 13 is an enlarged plan view of a portion "XIII" in FIG. 10, FIG. 14 is an enlarged plan view of a portion "XIV" in FIG. 10, and FIG. 15 is an enlarged plan view of a portion "XV" in FIG. 10.

Referring to FIG. 10, a metal wiring 200 of a semiconductor device of this example embodiment includes cell metal patterns 220, signal metal patterns 230, 232, 233, 234, 235, and 236 (e.g., a first signal-metal-pattern 230, a second signal-metal-pattern 232, a third signal-metal-pattern 233, a fourth signal-metal-pattern 234, a fifth signal-metal-pattern 235, and a sixth signal-metal-pattern 236) and dummy metal patterns 240, 242, 244, 246, 247, and 248 (e.g., a first dummy-metal-pattern 240, a second dummy-metal-pattern 242, a third dummy-metal-pattern 244, a fourth dummy-metal-pattern 246, fifth dummy-metal-pattern 247, and a sixth dummy-metal-pattern 248).

The cell metal patterns 220, the signal metal patterns 230, 232, 233, 234, 235, and 236 and the dummy metal patterns 240, 242, 244, 246, 247, and 248 may be formed on an upper surface of a semiconductor substrate 210. The semiconductor substrate 210 may have a cell region CR and a peripheral region PR. The cell metal patterns 220 may be formed in the cell region CR. The cell metal patterns 220 may be electrically connected with a circuit in the semiconductor substrate 210. The signal metal patterns 230, 232, 233, 234, 235, and 236 and the dummy metal patterns 240, 242, 244, 246, 247, and 248 may be formed in the peripheral region PR. The signal metal patterns 230, 232, 233, 234, 235, and 236 may be electrically connected to the circuit in the semiconductor substrate 210. In contrast, the dummy metal patterns 240, 242, 244, 246, 247, and 248 may not be connected to the circuit in the semiconductor substrate 210.

Because a shape of the cell metal patterns 220 may be determined in accordance with the shape of the cell mask patterns 120, the cell metal patterns 220 may have an elongated bar shape. The cell metal patterns 220 may be arranged by substantially the same interval. Thus, pitches between the cell metal patterns 220 may be substantially same to each other.

Because a shape of the signal metal patterns 230, 232, 233, 234, 235, and 236 may be determined in accordance with the shape of the first mask patterns 130, 132, 133, 134, 135, and 136, the signal metal patterns 230, 232, 233, 234, 235, and 236 may have an elongated bar shape. The signal metal patterns 230, 232, 233, 234, 235, and 236 may have a first width MW1 or a third width MW3. The first width MW1 of the signal metal mask patterns 230, 232, 233, 234, 235, and 236 may be substantially the same as a width of the cell metal patterns 220. According to some example embodiments, the first width MW1 of the signal metal patterns 230, 232, 233, 234, 235, and 236 may be different from the width of the cell metal patterns 220.

The dummy metal patterns 240, 242, 244, 246, 247, 248 may be formed in portions of the peripheral region PR of the semiconductor substrate 210 in which the signal metal patterns 230, 232, 233, 234, 235, and 236 are not arranged. Because a shape of the dummy metal patterns 240, 242, 244, 246, 247, and 248 may be determined in accordance with the shape of the second mask patterns 140, 142, 144, 146, 147, and 148, the dummy metal patterns 240, 242, 244, 246, 247, and 248 may have an elongated bar shape. The dummy metal patterns 240, 242, 244, 246, 247, and 248 may be positioned adjacent to the signal metal patterns 230, 232, 233, 234, 235, and 236. The dummy metal patterns 240, 242, 244, 246, 247, and 248 may have the second width MW2 substantially the same as the first width MW1 of the signal metal pattern 230.

Referring to FIG. 11, the dummy metal pattern 240 may be positioned adjacent to a signal metal pattern 232 having a relatively short length. The signal metal pattern 232 and the dummy metal pattern 240 may be positioned on a straight line. Because the first width MW1 of the signal metal pattern 232 may be substantially the same as the second width MW2 of the dummy metal pattern 240, the signal metal pattern 232 and the dummy metal pattern 240 may have a same center line CL along the straight line. The dummy metal pattern 240 may be spaced apart from the signal metal pattern 232 by a gap MG. The gap MG may be a distance between adjacent surfaces of the signal metal pattern 232 and the dummy metal pattern 240.

Referring to FIG. 12, a dummy metal pattern 242 having a relatively short length may be arranged between two signal metal patterns 234 and 235, each having a relatively short length, positioned on a straight line. The dummy metal pattern 242 may be positioned on the straight line. Thus, the signal metal patterns 234 and 235 and the dummy metal pattern 242 may have the common center line CL, along the straight line.

Further, a gap between the dummy metal pattern 242 and the signal metal pattern 234 may be substantially the same as a gap between the dummy metal pattern 242 and the signal metal pattern 235. For example, a first gap MG1 between adjacent side surfaces of the dummy metal pattern 242 and the signal metal pattern 234 may be substantially the same as a second gap MG2 between adjacent side surfaces of the dummy metal pattern 242 and the signal metal pattern 235. The first gap MG1 and the second gap MG2 may be substantially the same as the gap MG between the signal metal pattern 232 and the dummy metal pattern 240 in FIG. 11. The gap MG, the first gap MG1 and the second gap MG2 may be determined in accordance with a design rule of the metal wiring in the semiconductor device.

Referring to FIG. 13, the two signal metal patterns 230 in the peripheral region PR may be parallel to each other. The signal metal patterns 230 may have a first width MW1. In FIG. 13, the upper signal metal pattern 230 may have a first center line CL1. The lower signal metal pattern 230 may have a second center line CL2. A pitch between the signal metal patterns 230 in the peripheral region PR may be wider than the pitch between the cell metal patterns 220 in the cell region CR.

A dummy metal pattern 244 may be arranged between the signal metal patterns 230. The dummy metal pattern 244 may have a length substantially the same as the length of the signal metal patterns 230. The dummy metal pattern 244 may have the second width MW2 substantially the same as the first width MW1 of the signal metal patterns 230. The dummy metal pattern 244 may be substantially parallel to the signal metal patterns 230. Thus, the dummy metal pattern 244 may have a third center line CL3 substantially parallel to the first and second center lines CL1 and CL2 of the signal metal patterns 230.

The signal metal patterns 230 and the dummy metal pattern 244 may be arranged by substantially the same pitch. For example, a first pitch MP1 between the dummy metal pattern 244 and the upper signal metal pattern 230 may be substantially the same as a second pitch MP2 between the dummy metal pattern 244 and the lower signal metal pattern 230. That is, a distance between an upper surface of the dummy metal pattern 244 and a lower surface of the upper signal metal pattern 230 may be substantially the same as a distance between a lower surface of the dummy metal pattern 244 and an upper surface of the lower signal metal pattern 230.

Referring to FIG. 14, the signal metal pattern 230 and a signal metal pattern 236 in the peripheral region PR may be parallel to each other. In FIG. 14, the upper signal metal pattern 230 may have the first width MW1, and the lower signal metal pattern 236 may have a third width MW3 wider than the first width MW1. The upper signal metal pattern 230 may have a first center line CL1. The lower signal metal pattern 236 may have a second center line CL2. A pitch between the signal metal patterns 230 and 236 in the peripheral region PR may be wider than the pitch between the cell metal patterns 220 in the cell region CR.

A dummy metal pattern 246 may be arranged between the signal metal patterns 230 and 236. The dummy metal pattern 246 may have a length substantially the same as that of the signal metal patterns 230 and 236. The dummy metal pattern 246 may have the second width MW2 substantially the same as the first width MW1 of the signal metal pattern 230. According to some example embodiments, the second width MW2 of the dummy metal pattern 246 may be substantially the same as the third width MW3 of the signal metal pattern 236. The dummy metal pattern 246 may be parallel to the signal metal patterns 230 and 236. Thus, the dummy metal pattern 246 may have a third center line CL3 substantially parallel to the first and second center lines CL1 and CL2 of the signal metal patterns 230 and 236.

The signal metal patterns 230 and 236 and the dummy metal pattern 246 may be arranged by substantially the same pitch. For example, a third pitch MP3 between the dummy metal pattern 246 and the upper signal metal pattern 230 may be substantially the same as a fourth pitch MP4 between the dummy metal pattern 246 and the lower signal metal pattern 236. That is, a distance between an upper surface of the dummy metal pattern 246 and a lower surface of the upper signal metal pattern 230 may be substantially the same as a distance between a lower surface of the dummy metal pattern 246 and an upper surface of the lower signal metal pattern 236.

Referring to FIG. 15, the two signal metal patterns 230 in the peripheral region PR may be parallel to each other. The signal metal patterns 230 may have the first width MW1. In FIG. 15, the upper signal metal pattern 230 may have the first center line CL1. The lower signal metal pattern 230 may have the second center line CL2. A pitch between the signal metal patterns 230 in the peripheral region PR may be wider than the pitch between the cell metal patterns 220 in the cell region CR. For example, the pitch between the signal metal patterns 230 in FIG. 15 may be wider than the pitch between the signal metal patterns 230 in FIG. 13.

Because the pitch between the signal metal patterns 230 is relatively wide, for example, two dummy metal patterns 247 and 248 may be arranged between the signal metal patterns 230. The dummy metal patterns 247 and 248 may have a length substantially the same as that of the signal metal patterns 230. The dummy metal patterns 247 and 248 each may have the second width MW2 substantially the same as the first width MW1 of the signal metal pattern 230. The dummy metal patterns 247 and 248 may be parallel to the signal metal patterns 230. Thus, the dummy metal patterns 247 and 248 may have a third center line CL3 and a fourth center line CL4, respectively, substantially parallel to the first center line CL1 and the second center line CL2 of the signal metal patterns 230.

The signal metal patterns 230 and 236 and the dummy metal patterns 247 and 248 may be arranged by substantially the same pitch. For example, a fifth pitch MP5 between the upper dummy metal pattern 247 and the upper signal metal pattern 230, a sixth pitch MP6 between the lower dummy metal pattern 248 and the lower signal metal pattern 230, and a seventh pitch MP7 between the dummy metal patterns 247 and 248, may be substantially same to each other. That is, a distance between an upper surface of the upper dummy metal pattern 247 and a lower surface of the upper signal metal pattern 230, a distance between a lower surface of the upper dummy metal pattern 247 and an upper surface of the lower dummy metal pattern 248, and a distance between a lower surface of the lower dummy metal pattern 248 and an upper surface of the lower signal metal pattern 230 may be substantially same to each other.

In the present example embodiments, the two dummy metal patterns 247 and 248 are arranged between the signal metal patterns 230. However, the number of the dummy metal patterns between the signal metal patterns is not restricted to or within a specific number. The numbers of the dummy metal patterns between the signal metal patterns 230 may be determined in accordance with the pitch between the signal metal patterns 230.

According to some example embodiments, the second mask pattern for forming the dummy metal pattern in the peripheral region of the semiconductor substrate may be arranged between the first mask patterns for forming the signal metal pattern in the peripheral region of the semiconductor substrate. The width of the second mask pattern may be designed to be substantially the same as the width of the first mask pattern. Thus, the metal wiring in the peripheral region formed using a mask including the foregoing mask patterns may have a minute and uniform pitch corresponding to a pitch of the metal wiring in the cell region. Thus, the metal wiring in the peripheral region formed by using such mask and an off-axis illumination may yield a designed shape and size, thereby inhibiting or preventing a short between the metal wirings and/or a cut of the metal wiring in the peripheral region.

Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A mask comprising:
    a mask substrate including a cell exposure region and a peripheral exposure region, the cell exposure region configured to expose a metal layer in a cell region of a semiconductor device, the peripheral exposure region configured to expose the metal layer in a peripheral region of the semiconductor device;
    a first mask pattern including a first first-mask-pattern, a second first-mask-pattern, and a third first-mask-pattern for defining first photoresist patterns that expose the metal layer in the peripheral exposure region of the mask substrate to form a first signal metal pattern, a second signal metal pattern, and a third signal metal pattern, the first first-mask-pattern, the second first-mask-pattern, and the third first-mask-pattern being elongated in a first direction and arranged in a second direction perpendicular to the first direction; and
    a second mask pattern for defining a second photoresist pattern that exposes the metal layer in the peripheral exposure region of the mask substrate to form a dummy metal pattern, the second mask pattern being adjacent to the second first-mask-pattern in the first direction with a gap therebetween, the second mask pattern being between the first first-mask-pattern and the third first-mask-pattern in the second direction, and the second first-mask-pattern having a substantially same width as a width of the second mask pattern,
    wherein the first and second mask patterns include openings through which a light for forming the first signal metal pattern, the second signal metal pattern, the third signal metal pattern, and the dummy metal pattern passes.

2. The mask of claim 1, wherein the second mask pattern has a first center line coinciding with a second center line of the second first-mask-pattern along a straight line.

3. The mask of claim 1, further comprising:
    another first mask pattern including another first first-mask-pattern, another two second first-mask-patterns and another third first-mask-pattern that are elongated in the first direction and arranged in the second direction, the another two second first-mask-patterns arranged on a straight line; and
    another second mask pattern between the another two second first-mask-patterns along the straight line,
    wherein a first distance between the second mask pattern and one of the another two second first-mask-patterns is substantially same as a second distance between the second mask pattern and the other of the another two second first-mask-patterns.

4. The mask of claim 3, wherein first center lines of the another two second first-mask-pattern and a second center line of the another second mask pattern along the second direction coincide with each other along the straight line in the first direction.

5. The mask of claim 1, wherein
    the first first-mask-pattern, the second first-mask-pattern, and the third first-mask-pattern extend in the first direction and are parallel to each other;
    the second mask pattern extends in the first direction and is between the first first-mask-pattern and the third first-mask-pattern in the second direction; and a first distance between the second mask pattern and the first first-mask-pattern is substantially same as a second distance between the second mask pattern and the third first-mask-pattern.

6. The mask of claim 5, wherein the first distance is substantially same as a third distance between an adjacent pair of mask patterns in the cell exposure region.

7. The mask of claim 5, wherein
at least two of the first first-mask-pattern, the second first-mask-pattern, and the third first-mask-pattern included in the first mask pattern have different widths, and
the width of the second mask pattern is substantially same as the shortest one among the different widths of the at least two of the first first-mask-pattern, the second first-mask-pattern, and the third first-mask-pattern.

8. The mask of claim 5, further comprising:
another first mask pattern including another first first-mask-pattern, another two second first-mask-patterns, and another third first-mask-pattern;
another second mask pattern parallel to the second mask pattern, and the another second mask pattern being between the another first first-mask-pattern, the another two second first-mask-patterns, and the another third first-mask-pattern of the another first mask pattern; and
a third distance between the another second mask pattern and the another first first-mask-pattern is substantially same as the first distance.

9. The mask of claim 1, wherein each of the first first-mask-pattern and the third first-mask-pattern having a lateral length in the first direction corresponding to a sum of a first length of the second mask pattern, a second length of the second first-mask-pattern, and a third distance of the gap therebetween.

10. The mask of claim 1, wherein a first pitch between the first first-mask-pattern and the second mask pattern in the peripheral exposure region is substantially same as a second pitch between cell mask patterns in the cell exposure region.

11. The mask of claim 10, wherein a third pitch between the third first-mask-pattern and the second mask pattern in the peripheral exposure region is substantially same as the second pitch between the cell mask patterns in the cell exposure region.

12. The mask of claim 1, wherein a first length of the first first-mask-pattern is substantially same as a sum of a second length of the second first-mask-pattern and a third length of the second mask pattern.

13. The mask of claim 12, wherein the first length of the first first-mask-pattern is substantially same as a fourth length of the third first-mask-pattern.

14. The mask of claim 3, wherein a first length of the another first first-mask-pattern is substantially same as a sum of second lengths of the another two second first-mask-patterns and a third length of the another second mask pattern.

15. The mask of claim 14, wherein the first length of the another first first-mask-pattern is substantially same as a fourth length of the another third first-mask-pattern.

* * * * *